United States Patent [19]

Kan et al.

[11] Patent Number: 5,310,697
[45] Date of Patent: May 10, 1994

[54] METHOD FOR FABRICATING AN ALGAINP SEMICONDUCTOR LIGHT EMITTING DEVICE INCLUDING THE STEP OF REMOVING AN OXIDE FILM BY IRRADIATION WITH PLASMA BEAMS AND AN AS OR P MOLECULAR BEAM

[75] Inventors: Yasuo Kan; Kosei Takahashi, both of Nara; Masahiro Hosoda, Kashiba; Atsuo Tsunoda, Yamatokoriyama; Kentaro Tani, Tenri, all of Japan

[73] Assignee: Sharp Kabushiki Kaisha, Osaka, Japan

[21] Appl. No.: 993,058

[22] Filed: Dec. 18, 1992

[30] Foreign Application Priority Data

Dec. 20, 1991 [JP] Japan ................... 3-338804

[51] Int. Cl.$^5$ .............................. H01L 21/20
[52] U.S. Cl. .................. 437/129; 437/107; 437/127; 437/133; 437/937; 437/946; 148/DIG. 17; 156/643
[58] Field of Search ............... 437/129, 107, 127, 133, 437/937, 946; 148/DIG. 17; 156/643

[56] References Cited

U.S. PATENT DOCUMENTS

| | | | |
|---|---|---|---|
| 3,969,164 | 7/1976 | Cho et al. | 437/107 |
| 4,361,461 | 11/1982 | Chang | 437/946 |
| 4,371,968 | 2/1983 | Trussell, Jr. et al. | 437/129 |
| 4,477,311 | 10/1984 | Mimura et al. | 156/643 |
| 4,833,100 | 5/1989 | Hanafusa et al. | 437/939 |
| 5,212,701 | 5/1993 | Choquette et al. | 372/45 |

FOREIGN PATENT DOCUMENTS

| | | |
|---|---|---|
| 0456485 | 11/1991 | European Pat. Off. |
| 156760 | 12/1981 | Japan ............ 437/937 |
| 26119 | 1/1992 | Japan ............ 437/937 |

OTHER PUBLICATIONS

S. V. Hattangady, et al. "In situ cleaning of GaAs surfaces using hydrogen dissociated with a remote noble-gas discharge" J. Appl. Phys. 68(3) pp. 1233–1236 (1990).

K. Asakawa, et al. "Damage and contamination-free GaAs and AlGaAs etching using a novel ultrahigh-vacuum reactive ion beam etching system with etched surface monitoring and cleaning method" J. Vacuum. Sci. Tech. A4(3) May/Jun. 1986 pp. 677–680.

S. Sugata, et al. "GaAs cleaning with a hydrogen radical beam gun in an ultrahigh vacuum system"]J. Vac. Sci. Tech. B6(4), Jul./Aug. 1988, pp. 1087–1091.

Patent Abstracts of Japan vol. 13, No. 18, (E-704) Jan. 17, 1989. A copy of the corresponding Japanese Patent Publication No. 63224233 is also enclosed.

Patent Abstracts of Japan vol. 13, No. 486, (E-840) Nov. 6, 1989. A copy of corresponding Japanese Patent Publication No. 1192184 is also enclosed.

Patent Abstracts of Japan vol. 10, No. 306, (E-446) Oct. 17, 1989. A copy of the corresponding Japanese Patent Publication No. 61119090 is also enclosed.

Patent Abstracts of Japan vol. 13, No. 323, (E-791) Jul. 21, 1989. A copy of the corresponding Japanese Patent Publication No. 1090584 is also enclosed.

Tanaka et al., "Low-temperature GaAs epitaxial growth using electron-cyclotron resonance/metalorganic-molecular-beam epitaxy" J. Appl. Phys. (1988) 64(5):2778–2780.

Primary Examiner—Brian E. Hearn
Assistant Examiner—Linda J. Fleck
Attorney, Agent, or Firm—Morrison & Foerster

[57] ABSTRACT

A method for fabricating an AlGaInP semiconductor light emitting device having a substrate and a multilayer structure including an AlGaInP first semiconductor layer formed on the substrate. The method comprises the steps of removing part of the multilayer structure so that the first semiconductor layer is exposed, irradiating with plasma beams an oxide film formed on the exposed first semiconductor layer with the substrate temperature being kept at 500° C. or less, so as to remove the oxide film from the first semiconductor layer and growing a second semiconductor layer on the first semiconductor layer.

3 Claims, 2 Drawing Sheets

METHOD FOR FABRICATING AN ALGAINP SEMICONDUCTOR LIGHT EMITTING DEVICE INCLUDING THE STEP OF REMOVING AN OXIDE FILM BY IRRADIATION WITH PLASMA BEAMS AND AN AS OR P MOLECULAR BEAM

BACKGROUND OF THE INVENTION

1. Field of the Invention

The present invention relates to a method for fabricating an AlGaInP semiconductor light emitting device, and more particularly, to a method for fabricating an AlGaInP semiconductor light emitting device with high crystal quality and high reliability.

2. Description of the Related Art

In recent years, semiconductor light emitting devices, which have the advantages of compactness, high output, and low cost, have found applications in various fields. A semiconductor laser device, among others, has been used as a light source for industrial machines as well as for household apparatuses. Especially, the semiconductor laser device has made rapid progress in the application to the field of optical disk units and optical telecommunication.

A semiconductor light emitting device using an AlGaInP crystal, for example, can emit light with a wavelength of 680 nm or less. The wavelength range of the light emitted from this semiconductor light emitting device is shifted toward the shorter wavelengths by 100 nm or more compared with that of a conventional semiconductor light emitting device using an AlGaAs crystal. Therefore, by using the AlGaInP semiconductor laser device, the memory density of an optical disk unit and the like has been improved. The AlGaInP semiconductor laser device can also be used in place of a conventional He-Ne laser for apparatuses such as a laser printer and an optical measuring device, whereby such apparatuses can be made small and lightweight, and be driven with reduced power consumption.

In a semiconductor laser device, a waveguide is generally formed for confining light emitted from an active layer thereof laterally so as to obtain a stable lateral mode. One example of such a semiconductor laser device is a refractive index waveguide type semiconductor laser device, in which a stripe-shaped mesa portion is formed above the active layer and current confining layers having light absorption are formed on both sides of the mesa portion.

A conventional method for fabricating a semiconductor laser device provided with the mesa portion will be described as follows:

As shown in FIG. 2a, an n-type GaAs buffer layer 22, an n-type AlGaInP cladding layer 23, a GaInP active layer 24, a second p-type AlGaInP cladding layer 25, a GaInP etching stop layer 26, a first p-type AlGaInP cladding layer 27, a p-type GaInP intermediate layer 28, and a p-type GaAs contact layer 29 are sequentially formed on an n-type GaAs substrate 21 in this order. Each of these layers is grown by, for example, molecular beam epitaxy.

Then, as shown in FIG. 2b, an $SiO_2$ film 30 is formed on the p-type GaAs contact layer 29 by sputtering, and then patterned into a striped shape with a photoresist. Using the $SiO_2$ film 30 as a mask, the first p-type AlGaInP cladding layer 27, the p-type GaInP intermediate layer 28, and the p-type GaAs contact layer 29 are etched through until the surface of the GaInP etching stop layer 26 is exposed. Thus, a mesa portion in a striped shape is formed. The etching is conducted under normal atmospheric conditions.

With this etching, as shown in FIG. 2c, the exposed surface of the GaInP etching stop layer 26 and the side faces of the mesa portion are covered with an oxide film 32. Conventionally, the oxide film 32 is removed by exposing the n-type GaAs substrate 21 with the aforementioned semiconductor multilayer structure formed thereon to a high temperature of approximately 500° C. to 600° C. in a vacuum crystal growth chamber.

As shown in FIG. 2d, after the removal of the oxide film 32, an n-type GaAs current confining layer 31 is grown by molecular beam epitaxy so that the mesa portion is buried therein.

Then, as shown in FIG. 2e, the portion of the n-type GaAs current confining layer 31 formed on the top surface of the mesa portion is removed together with the underlying $SiO_2$ film 30. Thereafter, electrodes (not shown) are formed on the top surface of the p-type GaAs contact layer 29 and on the back surface of the n-type GaAs substrate 21, respectively. The thus fabricated wafer is divided into individual AlGaInP refractive index waveguide type semiconductor laser devices.

However, in an AlGaInP crystal, P or In escapes from the crystal face at a comparatively low temperature of approximately 500° C. According to the above-described method for fabricating a semiconductor laser device, the multilayer structure including the GaInP etching stop layer 26 is exposed to a high temperature of approximately 500° C. to 600° C. in the process of removing the oxide film 32 formed on the exposed surface of the GaInP etching stop layer 26 and on the side faces of the mesa portion. As a result, P or In escapes from the exposed surface of the GaInP etching stop layer 26 and the side faces of the first p-type AlGaInP cladding layer 27 and the p-type GaInP intermediate layer 28. This causes alteration in compositions at the exposed surface of the multilayer structure. When another semiconductor layer is formed on such a surface, lattice matching at the interface therebetween can not be attained, whereby the reliability of the resultant semiconductor laser device is reduced.

SUMMARY OF THE INVENTION

The method of the present invention for fabricating an AlGaInP semiconductor light emitting device having a substrate and a multilayer structure including an AlGaInP first semiconductor layer formed on the substrate comprises the steps of: removing part of the multilayer structure so that the first semiconductor layer is exposed; irradiating with plasma beams an oxide film formed on the exposed first semiconductor layer with the substrate temperature being kept at 500° C. or less, so as to remove the oxide film from the first semiconductor layer; and growing a second semiconductor layer on the first semiconductor layer.

According to the method of the present invention, the oxide layer formed on the semiconductor multilayer structure including an AlGaInP semiconductor layer which has an exposed surface can be removed without causing a substance contained in the exposed surface area of the semiconductor multilayer structure to escape from the semiconductor multilayer structure. As a result, when another semiconductor layer is grown on the exposed semiconductor layer of the semiconductor multilayer structure, failure in lattice matching at the interface therebetween is prevented.

Thus, the invention described herein makes possible the advantage of providing a method for fabricating an AlGaInP semiconductor light emitting device with improved crystal quality and high reliability.

These and other advantages of the present invention will become apparent to those skilled in the art upon reading and understanding the following detailed description with reference to the accompanying figures.

DESCRIPTION OF THE PREFERRED EMBODIMENTS

Referring to FIGS. 1a through 1e, the method of the present invention will be described by way of example. In this example, a method for fabricating a refractive index waveguide type semiconductor laser device provided with a mesa portion will be described.

Figure 1A:
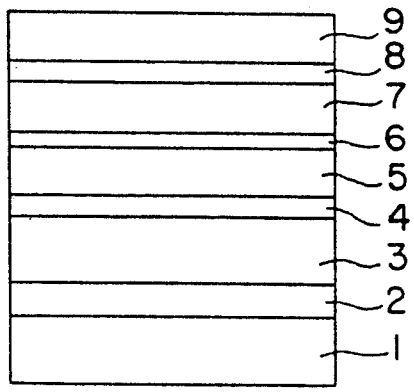
FIGS. 1a through 1e are partial sectional views showing the steps for fabricating an AlGaInP semiconductor light emitting device according to a method of the present invention.

As shown in FIG. 1a, an n-type GaAs buffer layer 2, an n-type AlGaInP cladding layer 3 (thickness: 1.0 μm), a GaInP active layer 4 (thickness: 80 nm), a second p-type AlGaInP cladding layer 5 (thickness: 0.2 μm), a GaInP etching stop layer 6 (thickness: 8 nm), a first p-type AlGaInP cladding layer 7 (thickness: 0.5 μm), a p-type GaInP intermediate layer 8 (thickness: 50 nm), and a p-type GaAs contact layer 9 are sequentially formed on a wafer n-type GaAs substrate 1 in this order. Each of these layers is grown by, for example, molecular beam epitaxy.

Figure 1B:
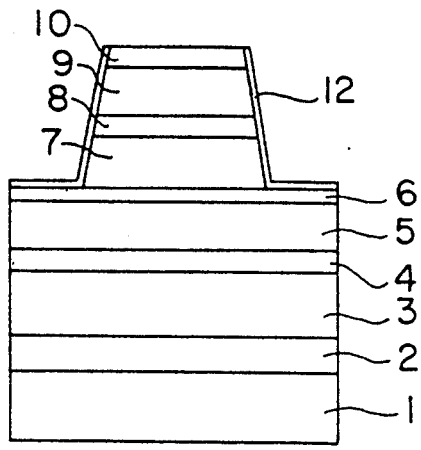

Then, as shown in FIG. 1b, an $SiO_2$ film 10 is formed on the p-type GaAs contact layer 9 by sputtering, and then patterned into a striped shape with a photoresist. Using the $SiO_2$ film 10 as a mask, the first p-type AlGaInP cladding layer 7, the p-type GaInP intermediate layer 8, and the p-type GaAs contact layer 9 are etched through until the surface of the GaInP etching stop layer 6 is exposed. Thus, a mesa portion in a striped shape is formed. A saturated Br water (SBW) solution and a sulfuric acid heat-etching solution may be used for the etching. An oxide film 12 is formed on the top surface of the GaInP etching stop layer 6 which has been exposed by the etching and on the side faces of the mesa portion.

Figure 1C:
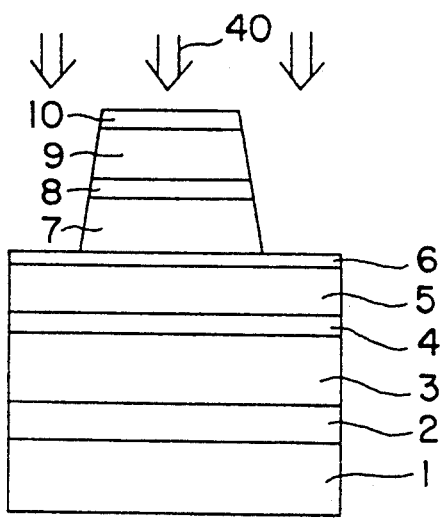

Then, as shown in FIG. 1c, the wafer n-type GaAs substrate 1 with the aforementioned semiconductor multilayer structure formed thereon is heated to 450° C. in a vacuum chamber, and then hydrogen plasma beams are radiated to the n-type GaAs substrate 1 from the side of the semiconductor multilayer structure as shown by arrow 40. By this radiation, the oxide film 12 can be removed without causing In or P to escape from the crystal face of the semiconductor layer covered with the oxide film 12. Thus, the crystal conditions on the exposed surface of the GaInP etching stop layer 6 and on the side faces of the mesa portion are kept unchanged. It is known to clean a GaAs substrate by ECR-activated hydrogen-plasma beams prior to crystal growth thereon (Y. Tanaka et al., J. Appl. Phys., 64 (5), 1 September, 1988). However, it is not known to use the hydrogen plasma to remove an oxide film as described above.

It is preferable to radiate As molecular beams simultaneously with the plasma radiation, so as to obtain an As atmosphere of approximately $5 \times 10^{-7}$ Torr in the vacuum chamber. In this way, by irradiating the crystal face to be cleaned with As molecular beams for increasing the pressure around the crystal face, the escape of P or In from the exposed crystal face can be effectively prevented. The conditions of the crystal face can be observed by monitoring an image thereof obtained by reflection high energy electron diffraction. In this example, the electron diffraction image showed a complete streak state in approximately one hour, indicating that the oxide film 12 had been completely removed and the crystal face had been cleaned.

Figure 1D:
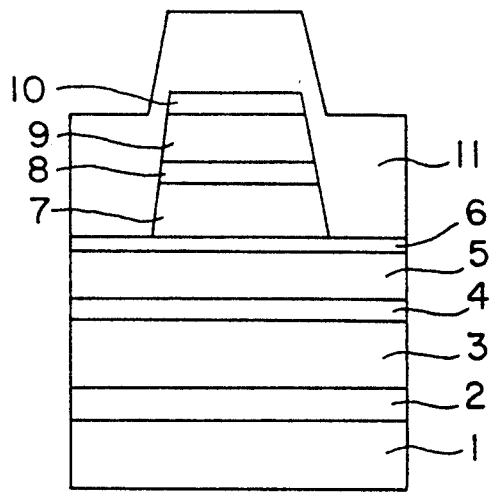

As shown in FIG. 1d, after the removal of the oxide film 12, an n-type GaAs current confining layer 11 is grown by molecular beam epitaxy so that the mesa portion is buried therein.

Figure 1E:
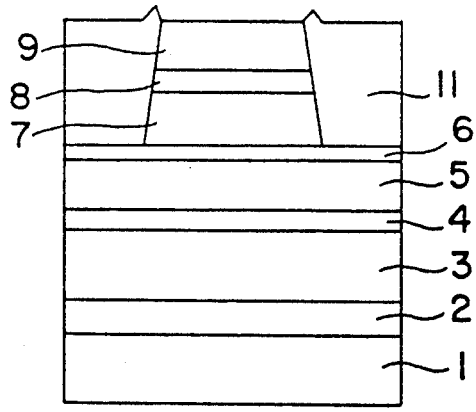
Figure 2A:
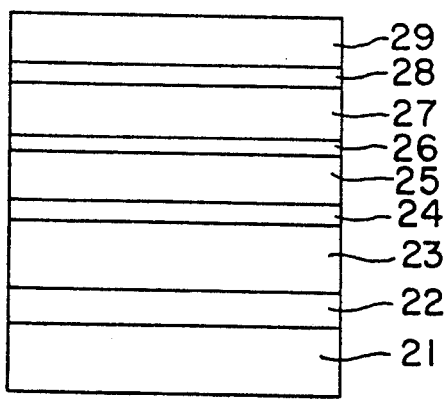
FIGS. 2a through 2e are partial sectional views showing the steps for fabricating a conventional AlGaInP semiconductor light emitting device.
Figure 2B:
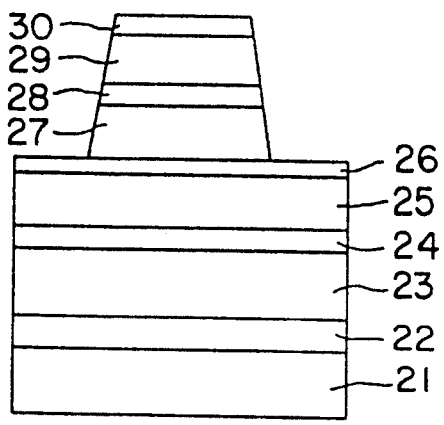
Figure 2C:
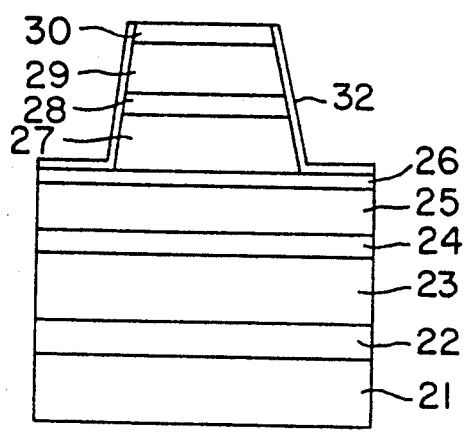
Figure 2D:
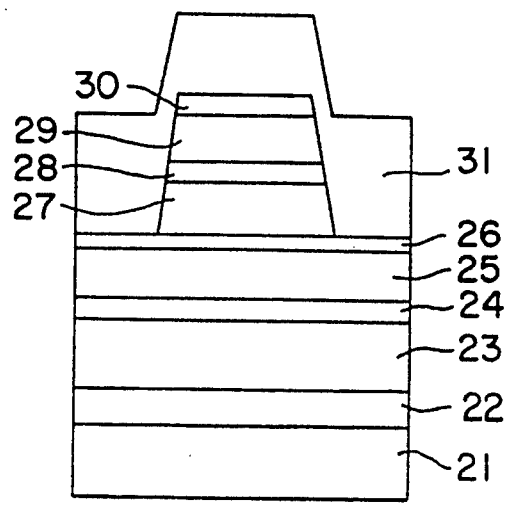
Figure 2E:
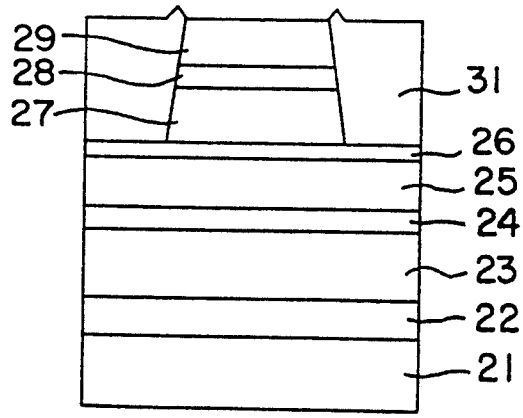

Then, as shown in FIG. 1e, the portion of the n-type GaAs current confining layer 11 formed on the top surface of the mesa portion is removed together with the underlying $SiO_2$ film 10. Thereafter, an Au-Zn electrode (not shown) is formed on the top surface of the p-type GaAs contact layer 9 and an Au-Ge-Ni electrode (not shown) is formed on the back surface of the n-type GaAs substrate 1. The thus fabricated wafer is divided into individual AlGaInP refractive index waveguide type semiconductor laser devices.

The semiconductor laser device fabricated according to this example was observed with an electron microscope. As a result, it was found that the conditions of the interfaces between the GaInP etching stop layer 6 and the n-type GaAs current confining layer 11 and between the mesa portion and the the n-type GaAs current confining layer 11 were excellent without any deterioration in crystals such as crystal defects.

Oxygen or chlorine can also be used for the plasma radiation instead of hydrogen used in the above example, though hydrogen is preferable because it is highly reactive and can provide plasma with high purity. P can be used for molecular beams radiated simultaneously with the plasma radiation. The substrate was heated to 450° C. in this example, but the cleaning can be completed in a shorter period of time by selecting a higher temperature as far as it does not exceed 500° C. when In or P starts to escape from the crystal face.

Other methods for growing semiconductor layers, such as liquid phase epitaxy and metal organic-chemical vapor deposition can be employed besides the molecular beam epitaxy used in this example.

The active layer 4 can be formed of AlGaInP, instead of GaInP. Also, the method of the present invention can be applicable to a semiconductor laser device having a light emitting region of a quantum well structure or a separate confinement heterostructure.

The method of the present invention is preferably used for fabricating a refractive index waveguide type semiconductor laser device provided with a mesa portion as shown in the above example. According to the method of the present invention, the current confining layer 11 required for this type of the semiconductor laser device can be formed without failure in lattice matching, and thus the reliability of the resultant semiconductor laser device is enhanced.

The present invention can be used as a method for fabricating all types of AlGaInP semiconductor light emitting devices, which involves a step of growing a semiconductor layer on an exposed AlGaInP layer. For example, this invention can be used as a method for fabricating a semiconductor light emitting device comprising the steps of forming a current confining layer over a light emitting region formed on a substrate, removing part of the current confining layer to form a groove in a striped shape extending therethrough, and filling the groove with semiconductor material to form a semiconductor layer. In this case, the same effect as stated in the above example can be obtained; an oxide film formed can be removed without causing a substance to escape from the semiconductor layer. Thus, a clean crystal face free from crystal defects can be obtained.

The semiconductor light emitting device fabricated according to the above example was compared with that fabricated according to the conventional method in which the oxide film was removed by exposure to a high temperature before the growth of the current confining layer. As a result, the former showed far better reliability than the latter.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating an AlGaInP semiconductor light emitting device having a substrate and a multilayer structure including an AlGaInP first semiconductor layer formed on the substrate, the method comprising the steps of:

removing part of the multilayer structure so that the first semiconductor layer is exposed;

irradiating with plasma beams an oxide film formed on the exposed first semiconductor layer with the substrate temperature being kept at 500° C. or less, so as to remove the oxide film from the first semiconductor layer; and growing a second semiconductor layer on the first semiconductor layer;

wherein a molecular beam selected from the group consisting of As molecular beams and P molecular beams is used to irradiate the oxide film simultaneously with the step of irradiating the oxide film with the plasma beams.

2. A method according to claim 1, wherein the step of irradiating with plasma beam is conducted using hydrogen.

3. A method according to claim 1, wherein the step of removing part of the multilayer structure is conducted so that a mesa portion in a striped shape is formed.

* * * * *